United States Patent
Liao et al.

(10) Patent No.: US 9,966,418 B2
(45) Date of Patent: May 8, 2018

(54) PIXEL STRUCTURE, ORGANIC LIGHT EMITTING DISPLAY PANEL AND METHOD FOR FABRICATING THE SAME, AND DISPLAY DEVICE

(71) Applicant: BOE TECHNOLOGY GROUP CO., LTD., Beijing (CN)

(72) Inventors: Chinlung Liao, Beijing (CN); Guang Yan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days. days.

(21) Appl. No.: 15/235,158

(22) Filed: Aug. 12, 2016

(65) Prior Publication Data
US 2017/0271413 A1    Sep. 21, 2017

(30) Foreign Application Priority Data
Mar. 18, 2016    (CN) .......................... 2016 1 0159054

(51) Int. Cl.
*H01L 27/32* (2006.01)
*H01L 51/56* (2006.01)

(52) U.S. Cl.
CPC ........ *H01L 27/322* (2013.01); *H01L 27/3276* (2013.01); *H01L 51/56* (2013.01)

(58) Field of Classification Search
CPC .... H01L 27/322; H01L 27/3276; H01L 51/56
See application file for complete search history.

(56) References Cited

U.S. PATENT DOCUMENTS

| 2006/0152150 A1* | 7/2006 | Boerner | C09K 11/0883 313/506 |
| 2012/0075278 A1* | 3/2012 | Hara | G09G 3/3208 345/211 |
| 2015/0349284 A1* | 12/2015 | Seo | H01L 51/5016 257/40 |
| 2016/0093678 A1* | 3/2016 | Seo | H01L 51/5265 257/89 |

* cited by examiner

*Primary Examiner* — Fernando L Toledo
*Assistant Examiner* — Neil Prasad
(74) *Attorney, Agent, or Firm* — Nath, Goldberg & Meyer; Joshua B. Goldberg; Annie Kock

(57) ABSTRACT

The present invention discloses a pixel structure, an organic light emitting display panel and a method for fabricating the same, and a display device. The pixel structure includes a plurality of organic light emitting diodes capable of emitting light of multiple colors and a plurality of light filtering portions provided at a light emitting side of the plurality of organic light emitting diodes, wherein each light filtering portion is provided in correspondence with each of a part of the organic light emitting diodes, such that light emitted from each of the part of the organic light emitting diodes passes through corresponding light filtering portion while light emitted from the remaining of the organic light emitting diodes does not pass through any light filtering portion, and the light filtering portions each process light having a color corresponding to the color of light emitted by corresponding organic light emitting diode.

15 Claims, 3 Drawing Sheets

PIXEL STRUCTURE, ORGANIC LIGHT EMITTING DISPLAY PANEL AND METHOD FOR FABRICATING THE SAME, AND DISPLAY DEVICE

CROSS-REFERENCE TO RELATED APPLICATIONS

The present application claims the priority of Chinese Patent Application No. 201610159054.1, filed on Mar. 18, 2016, the contents of which are incorporated herein in their entirety by reference.

FIELD OF THE INVENTION

The present invention relates to the field of display technology, and particularly relates to a pixel structure, an organic light emitting display panel and a method for fabricating the same, and a display device.

BACKGROUND OF THE INVENTION

In an organic-light-emitting-diode (OLED) display, each pixel structure includes a plurality of organic light emitting diodes, which include anodes, cathodes and organic function layers including light emitting layers and provided between anodes and cathodes, and have a working principle that the organic function layers is driven by an electrical field between the anodes and the cathodes so that light can be emitted due to injection and recombination of carriers. The organic function layers having different materials in different areas emit light of different colors.

In the prior art, color resistance blocks are usually provided at a light emitting side of the plurality of OLEDs in order to implement wide color gamut. As illustrated in FIG. 1, a red color resistance block 2r corresponding to a red OLED 1r, a green color resistance block 2g corresponding to a green OLED 1g and a blue color resistance block 2b corresponding to a blue OLED 1b are respectively arranged so as to filter light emitted by each light emitting diode, respectively, thereby improving color purity of light emitted by each light emitting diode and implementing wide color gamut. However, luminous efficiency of the OLEDs is decreased due to the filter effect of the color resistance block, and in particular to a blue OLED having a relatively low efficiency, the luminous efficiency is decreased more significantly, so the OLED has high power consumption and short lifetime, thereby affecting power consumption and lifetime of a display device.

SUMMARY

An object of the present invention is at least to provide a pixel structure, an organic light emitting display panel and a method for fabricating the same, and a display device, so as to reduce power consumption of the display device and extend its lifetime.

To achieve the above object, as an aspect of the present invention, there is provided a pixel structure, which includes a plurality of organic light emitting diodes capable of emitting light of multiple colors and a plurality of light filtering portions provided at a light emitting side of the plurality of organic light emitting diodes, wherein each light filtering portion is provided in correspondence with each of a part of the organic light emitting diodes, such that light emitted from each of the part of the organic light emitting diodes passes through corresponding light filtering portion while light emitted from the remaining of the organic light emitting diodes does not pass through any light filtering portion, and each of the light filtering portions processes light having a color corresponding to the color of light emitted by corresponding organic light emitting diode.

Optionally, the light filtering portion includes a color resistance block which is capable of processing light having the same color as that of light emitted by the corresponding organic light emitting diode.

Optionally, the plurality of the organic light emitting diodes include a red organic light emitting diode, a green organic light emitting diode and a blue organic light emitting diode, and the light filtering portions include a red color resistance block arranged in correspondence with the red organic light emitting diode and a green color resistance block arranged in correspondence with the green organic light emitting diode.

Optionally, the organic light emitting diode includes a first electrode, a first function layer, a light emitting layer, a second function layer and a second electrode arranged sequentially along a light-exiting direction.

Optionally, the light emitting layer of the blue organic light emitting diode extends onto and covers the light emitting layer of the red organic light emitting diode and the light emitting layer of the green organic light emitting diode so as to cover an entire area of the pixel structure, and the light emitting layer of the red organic light emitting diode and the light emitting layer of the green organic light emitting diode are arranged at a same layer between the light emitting layer of the blue organic light emitting diode and the second electrode.

Optionally, the first electrodes of the plurality of the organic light emitting diodes are formed as an integrated structure, and the first function layers of the plurality of the organic light emitting diodes are formed as an integrated structure.

Optionally, the first function layer includes an electron transport layer and an electron injection layer disposed between the electron transport layer and the first electrode, and the second function layer includes a hole transport layer and a hole injection layer disposed between the hole transport layer and the second electrode.

Optionally, the plurality of light filtering portions are disposed between the organic light emitting diodes and a base substrate, and the pixel structure further includes a transparent planarization layer provided between the plurality of light filtering portions, the base substrate and the organic light emitting diodes.

Optionally, the light emitting layer of the blue organic light emitting diode has a thickness ranging from 20 nm to 50 nm, and each of the light emitting layers of the red organic light emitting diode and the green organic light emitting diode has a thickness ranging from 40 nm to 80 nm.

The pixel structure according to an aspect of the present invention may further include a plurality of thin film transistors provided in correspondence with each of the plurality of the organic light emitting diodes, respectively, the plurality of thin film transistors being disposed between the base substrate and the plurality of light filtering portions, a drain electrode of each of the thin film transistors being connected to the second electrode of the corresponding organic light emitting diode through a via in the planarization layer, a source electrode of each of the thin film transistors being connected to a data line, and a gate electrode of each of the thin film transistors being connected to a gate line.

As another aspect of the present invention, there is provided an organic light emitting display panel, which includes a base substrate divided into a plurality of pixel regions, the above pixel structure according to an aspect of the present invention being provided in at least one of the pixel regions.

As another aspect of the present invention, there is provided a method for fabricating an organic light emitting display panel, comprising steps of:

providing a base substrate which is divided into a plurality of pixel regions;

forming, in at least one of the pixel regions, a plurality of organic light emitting diodes which are capable of emitting light of multiple colors; and forming a plurality of light filtering portions at a light emitting side of the plurality of organic light emitting diodes, each light filtering portion being provided in correspondence with each of a part of the organic light emitting diodes, such that light emitted from each of the part of the organic light emitting diodes passes through corresponding light filtering portion while light emitted from the remaining of the organic light emitting diodes does not pass through any light filtering portion, and the light filtering portions each process light having a color corresponding to the color of light emitted by corresponding organic light emitting diode.

Optionally, the plurality of the organic light emitting diodes include a red organic light emitting diode, a green organic light emitting diode and a blue organic light emitting diode, the light filtering portions include color resistance blocks, and the step of forming the plurality of light filtering portions at the light emitting side of the plurality of organic light emitting diodes includes: forming a red color resistance block and a green color resistance block at light emitting sides of the red organic light emitting diode and the green organic light emitting diode, respectively.

Optionally, the step of forming the plurality of organic light emitting diodes in at least one of the pixel regions includes:

forming, in at least one of the pixel regions, a plurality of second electrodes corresponding to the plurality of the organic light emitting diodes, respectively;

forming, on the plurality of the second electrodes, a plurality of second function layers corresponding to the plurality of the second electrodes, respectively, by means of a solution method;

forming a light emitting layer of the red organic light emitting diode, a light emitting layer of the green organic light emitting diode and a light emitting layer of the blue organic light emitting diode, respectively, on the second function layer;

forming, on the light emitting layers, a first function layer covering the entire pixel region by means of vapor deposition; and forming, on the first function layer, a first electrode covering the entire pixel region by means of vapor deposition.

Optionally, the step of forming a light emitting layer of the red organic light emitting diode, a light emitting layer of the green organic light emitting diode and a light emitting layer of the blue organic light emitting diode includes:

forming, by means of the solution method, the light emitting layer of the red organic light emitting diode on the second function layer of the red organic light emitting diode, and the light emitting layer of the green organic light emitting diode on the second function layer of the green organic light emitting diode; and forming, by means of vapor deposition, the light emitting layer of the blue organic light emitting diode within the entire pixel region, such that the light emitting layer of the blue organic light emitting diode is above the light emitting layers of the red organic light emitting diode and the green organic light emitting diode, and covers the light emitting layers of the red organic light emitting diode and the green organic light emitting diode.

Optionally, the method further includes a step of:

forming a transparent planarization layer, before the step of forming the plurality of organic light emitting diodes in at least one of the pixel regions and after the step of forming the plurality of light filtering portions at the light emitting side of the plurality of organic light emitting diodes.

As another aspect of the present invention, there is provided a display device including the above organic light emitting display panel according to an aspect of the present invention.

In the present invention, the plurality of light filtering portions are provided at the light emitting side of the plurality of the organic light emitting diodes, wherein each light filtering portion is provided in correspondence with each of a part of the organic light emitting diodes. The light filtering portions can be arranged according to the color of light emitted by the organic light emitting diode, such that the light filtering portions are arranged in correspondence with an organic light emitting diode(s) having high luminous efficiency and low color purity of light, while no light filtering portion is arranged at a position(s) corresponding to an organic light emitting diode(s) having low luminous efficiency and high color purity of light so as to improve luminous efficiency of said organic light emitting diode(s) and extend its lifetime, thereby improving overall luminous efficiency of the pixel structure, extending lifetime of the display device, reducing its power consumption and barely affecting color purity of light emitted from the pixel structure.

BRIEF DESCRIPTION OF THE DRAWINGS

The accompanying drawings, which constitute a part of the specification, are provided for further understanding of the present invention, and for explaining the present invention together with the following specific implementations, but not intended to limit the present invention. In the drawings.

DETAILED DESCRIPTION

Specific embodiments of the present invention will be described below in detail in conjunction with the accompanying drawings. It should be understood that the embodiments to be described herein is only intended to illustrate and explain the present invention, but not to limit the present invention.

Figure 1:
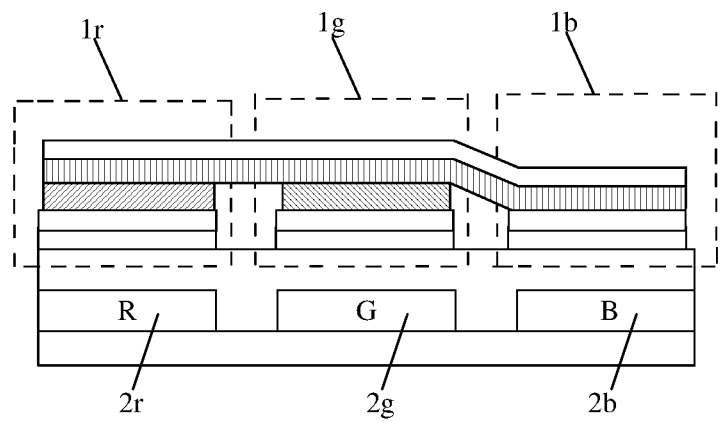
FIG. 1 is a structural diagram of a pixel structure in the prior art.
Figure 2:
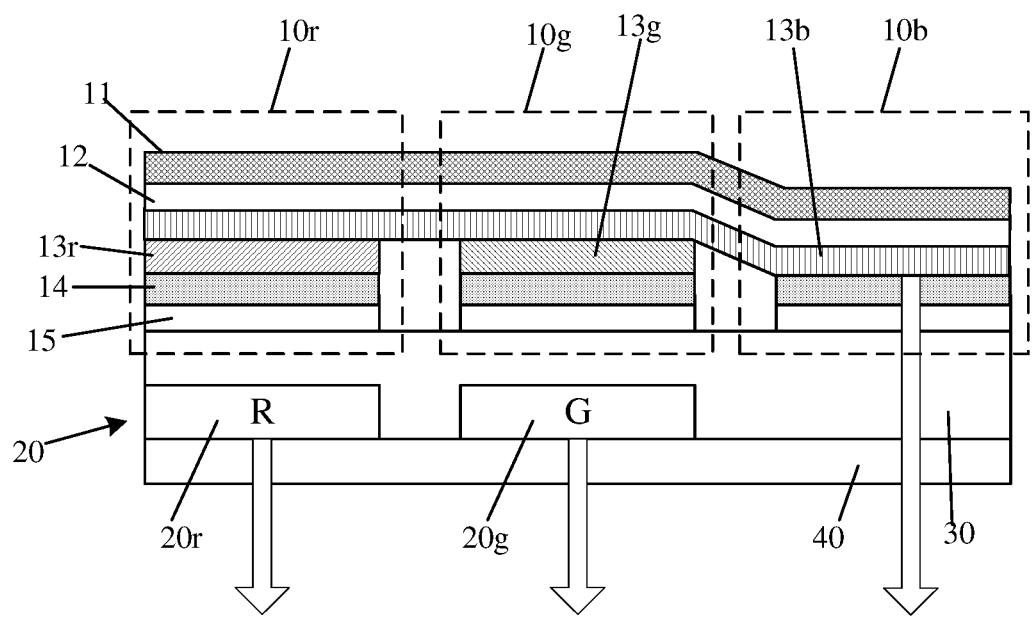
FIG. 2 is a structural diagram of a pixel structure according to an embodiment of the present invention.

As an aspect of the present invention, there is provided a pixel structure, which includes a plurality of organic light emitting diodes (for example, a red organic light emitting diode 10r, a green organic light emitting diode 10g and a blue organic light emitting diode 10b as shown in FIG. 2) capable of emitting light of multiple colors and a plurality of light filtering portions 20 (for example, the light filtering portions 20r and 20g as shown in FIG. 2) provided at a light emitting side of the plurality of organic light emitting diodes, wherein each light filtering portion 20 is provided in correspondence with each of a part (for example, the organic light emitting diodes 10r and 10g as shown in FIG. 2) of the organic light emitting diodes, such that light emitted from each of the part of the organic light emitting diodes passes through corresponding light filtering portion (for example, light emitted from the red organic light emitting diode 10r passes through the light filtering portion 20r, and light emitted from the green organic light emitting diode 10g passes through the light filtering portion 20g), while light emitted from the remaining (for example, the blue organic light emitting diode 10b) of the organic light emitting diodes does not pass through any light filtering portion. The light filtering portions 20 each process light having a color corresponding to the color of light emitted by corresponding organic light emitting diode. The light filtering portion 20 may include a color resistance block.

In the present invention, as compared to the prior art, light filtering portions are not provided at the light emitting sides of all organic light emitting diodes; rather, the light filtering portions are only provided at positions corresponding to a part of the organic light emitting diodes. That is, color resistance block(s) of corresponding color is provided at the light emitting side of corresponding organic light emitting diode(s), and no color resistance block is provided or only a transparent block is provided at the light emitting side of the remaining of the organic light emitting diodes. Since various organic light emitting diodes have different luminous efficiencies and emit light having different color purities due to differences between stabilities of materials of light emitting layers of various organic light emitting diodes, the light filtering portions can be arranged according to the color of light emitted from the organic light emitting diode, such that the light filtering portions are arranged in correspondence with the organic light emitting diodes having high luminous efficiency and low color purity of light, while no light filtering portion is arranged at a position(s) corresponding to an organic light emitting diode(s) having low luminous efficiency and high color purity of light so as to improve luminous efficiency of said organic light emitting diode(s) and extend its lifetime, thereby improving overall luminous efficiency of the pixel structure, and thus extending lifetime of the display device, reducing its power consumption and barely affecting color purity of light emitted from the pixel structure.

As a specific implementation of the present invention, as shown in FIG. 2, the plurality of the organic light emitting diodes include a red organic light emitting diode 10r, a green organic light emitting diode 10g and a blue organic light emitting diode 10b, and the light filtering portions include a red color resistance block 20r arranged in correspondence with the red organic light emitting diode 10r and a green color resistance block 20g arranged in correspondence with the green organic light emitting diode 10g, while no color resistance block is arranged at a position corresponding to the blue organic light emitting diode 10b.

Since light-emitting materials of the red organic light emitting diode 10r and the green organic light emitting diode 10g have high luminous efficiency and emit light having low color purity, and light-emitting material of the blue organic light emitting diode 10b has low luminous efficiency and emits light having high color purity, the color purities of light emitted from the red organic light emitting diode 10r and the green organic light emitting diode 10g can be increased by the arrangement of the red color resistance block 20r and the green color resistance block 20g, respectively, and luminous efficiency of the blue organic light emitting diode 10b is improved due to the fact that light emitted from the blue organic light emitting diode 10b directly passes through the base substrate 40 without passing through any color resistance block. Table 1 is a table for comparing current efficiencies of the blue organic light emitting diode 10b according to an embodiment of the present invention and the blue organic light emitting diode 1b in the prior art, and for reference, the chromaticity coordinate for standard blue color is (0.14, 0.08). It can be seen from Table 1 that, compared to the prior art, the chromaticity coordinate for light emitted from the blue organic light emitting diode 10b according to an embodiment of the present invention does not change much while the current efficiency is improved significantly, thereby significantly improving luminous efficiency of the blue organic light emitting diode while barely affecting color purity. As a result, the present invention can significantly improve luminous efficiency of the blue organic light emitting diode 10b while barely affect color purity of light emitted therefrom.

TABLE 1

| | chromaticity coordinate for color of light | Current efficiency (cd/A) |
| --- | --- | --- |
| Blue organic light emitting diode in the prior art | (0.139, 0.055) | 2.1 |
| Blue organic light emitting diode according to an embodiment of the present invention | (0.136, 0.058) | 5.0 |

Further, as shown in FIG. 2, each organic light emitting diode includes a first electrode 11, a first function layer 12, a light emitting layer (for example, a light emitting layer 13r, 13g or 13b), a second function layer 14 and a second electrode 15 arranged sequentially along a light-exiting direction. When the first electrode 11 and the second electrode 15 are connected to two terminals of a power supply, respectively, electrons and holes are injected to the light emitting layer from the first electrode 11 and the second electrode 15, respectively, and recombine to release energy and transfer the energy to light-emitting molecules, such that the light-emitting molecules are excited to make transition, and thus photons are generated to release optical energy.

Those skilled in the art may understand that, as shown in FIG. 2, the first electrodes 11 of the plurality of the organic light emitting diodes may be formed as an integrated structure, and the first function layers 12 of the plurality of the organic light emitting diodes may also be formed as an integrated structure. The first electrode 11 may be a metal layer, such as a lithium layer, a sodium layer, a potassium layer, a calcium layer, a barium layer, a magnesium layer, a silver layer, an aluminum layer or the like. It can be understood that, in order to allow light emitted by the light emitting layer to exit from the pixel structure, the second electrode 15 is a transparent electrode, and specifically, may include a transparent conductive layer of indium tin oxide, indium zinc oxide or the like. Specifically, the first function layer 12 may include an electron transport layer and an electron injection layer disposed between the electron transport layer and the first electrode 11, and the second function layer may include a hole transport layer and a hole injection layer disposed between the hole transport layer and the second electrode 15.

Further, in a case where the plurality of organic light emitting diodes include a red organic light emitting diode 10r, a green organic light emitting diode 10g and a blue organic light emitting diode 10b, the light emitting layer 13b of the blue organic light emitting diode 10b extends onto and covers the light emitting layer 13r of the red organic light emitting diode 10r and the light emitting layer 13g of the green organic light emitting diode 10g so as to cover an entire area of the pixel structure, and the light emitting layer 13r of the red organic light emitting diode 10r and the light emitting layer 13g of the green organic light emitting diode 10g are arranged at a same layer between the light emitting layer 13b of the blue organic light emitting diode 10b and the second electrode 15.

As shown in FIG. 2, the organic light emitting diodes 10r, 10g and 10b may be bottom-emitting organic light emitting diodes, and in this case, the light portions 20 are disposed between the plurality of organic light emitting diodes and the base substrate 40. In order to provide a flat base substrate having the light filtering portions 20 thereon for facilitating the arrangement of the organic light emitting diodes, the pixel structure further includes a transparent planarization layer 30 provided between the light filtering portions 20 and the organic light emitting diodes. The planarization layer 30 may include transparent photoresist material.

It can be understood that the pixel structure may further include a thin film transistor (not shown in the drawings) corresponding to each organic light emitting diode, which may be provided between the base substrate 40 and the planarization layer 30 or the plurality of light filtering portions 20. A drain electrode of each of the thin film transistors is connected to the second electrode 15 of the corresponding organic light emitting diode through a via in the planarization layer 30, a source electrode of the thin film transistor is connected to a data line, and a gate electrode of the thin film transistor is connected to a gate line, so a data signal on the data line is outputted to the second electrode 15 of the corresponding organic light emitting diode when the voltage at the gate line reaches a turn-on voltage.

As a second aspect of the present invention, there is provided an organic light emitting display panel, which includes a base substrate 40 divided into a plurality of pixel regions as shown in FIG. 2, the above pixel structure according to an embodiment of the present invention being provided in at least one of the pixel regions.

As a third aspect of the present invention, there is provided a method for fabricating an organic light emitting display panel, which will be described in details with reference to FIGS. 2 to 8. The method comprises steps of:

providing a base substrate 40;

forming, in at least one of the pixel regions, a plurality of organic light emitting diodes (for example, the red organic light emitting diode 10r, the green organic light emitting diode 10g and the blue organic light emitting diode 10b as shown in FIG. 2) capable of emitting light of multiple colors; and forming a plurality of light filtering portions 20 at a light emitting side of the plurality of organic light emitting diodes, each light filtering portion 20 being provided in correspondence with each of a part of the organic light emitting diodes, such that light emitted from each of the part of the organic light emitting diodes passes through corresponding light filtering portion while light emitted from the remaining of the organic light emitting diodes does not pass through any light filtering portion, and the light filtering portions each process light having a color corresponding to the color of light emitted by corresponding organic light emitting diode.

Figure 3:
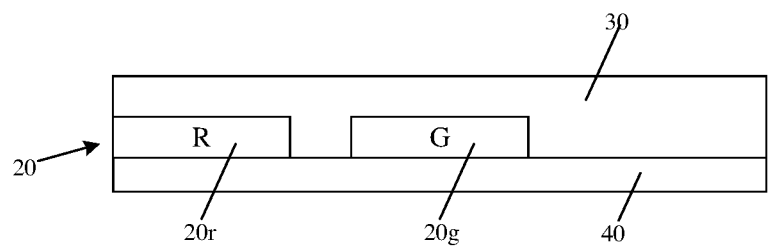
FIG. 3 is a structural diagram after formation of a light filtering portion and a planarization layer during a manufacture process of an organic light emitting display panel according to an embodiment of the present invention.

It can be understood that the sequence of the above two steps depends on the light-emitting type of the organic light emitting diodes. In a case where the organic light emitting diodes are bottom-emitting organic light emitting diodes, the plurality of light filtering portions 20 are formed first, and then the organic light emitting diodes are formed. In a case where the organic light emitting diodes are top-emitting organic light emitting diodes, the organic light emitting diodes are formed first, and then are arranged opposite to and aligned with a cover plate including light filtering portions. In embodiments of the present invention, the bottom-emitting organic light emitting diodes are illustrated as an example. As shown in FIG. 3, firstly, the plurality of light filtering portions 20 are formed on the base substrate 40; then, a transparent planarization layer 30 is formed on the base substrate 40 formed with the light filtering portions 20; and thereafter, as shown in FIGS. 4 to 8, the plurality of organic light emitting diodes are formed on the base substrate 40 formed with the planarization layer 30. The planarization layer 30 may be formed by transparent photoresist material.

The present invention does not limit the number of organic light emitting diodes 10 and the colors of light emitted from respective organic light emitting diodes. For example, the plurality of organic light emitting diodes may include a red organic light emitting diode, a green organic light emitting diode and a blue organic light emitting diode, or may include a red organic light emitting diode, a green organic light emitting diode, a blue organic light emitting diode and a yellow organic light emitting diode. In view of specific colors of light emitted by the plurality of organic light emitting diodes, the plurality of light filtering portions 20 are arranged at positions corresponding to organic light emitting diodes having high luminous efficiency, while no light filtering portion is arranged at a position corresponding to an organic light emitting diode having low luminous efficiency.

As a specific implementation of the present invention, as shown in FIG. 2, the plurality of the organic light emitting diodes include a red organic light emitting diode 10r, a green organic light emitting diode 10g and a blue organic light emitting diode 10b. The step of forming the plurality of light filtering portions 20 at the light emitting side of the plurality of organic light emitting diodes includes forming a red color resistance block 20r and a green color resistance block 20g at light emitting sides of the red organic light emitting diode 10r and the green organic light emitting diode 10g, respectively.

Color resistance blocks may be formed by a photolithography process. Color resistance blocks of different colors include different materials, and thus different photolithography processes are required to fabricate color resistance blocks of different colors, respectively. In the method according to an embodiment of the present invention, the step of forming the light filtering portions 20 merely includes fabricating a red color resistance block 41 and a green color resistance block 42, which reduces the number of process steps.

Figure 4:
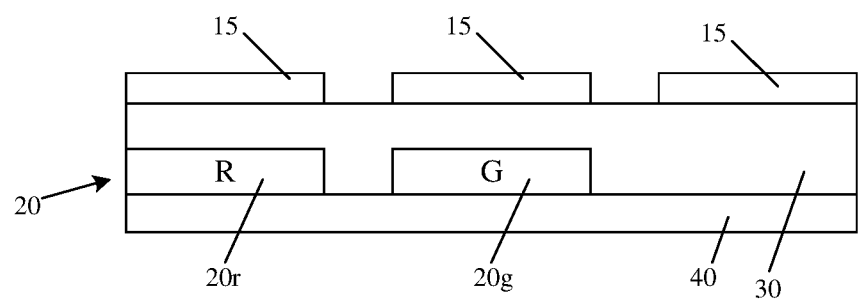
FIG. 4 is a structural diagram after formation of a second electrode during the manufacture process of the organic light emitting display panel according to the embodiment of the present invention.
Figure 5:
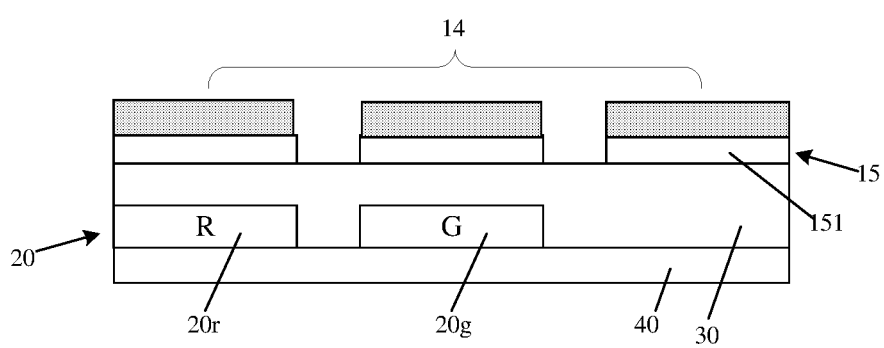
FIG. 5 is a structural diagram after formation of a second function layer during the manufacture process of the organic light emitting display panel according to the embodiment of the present invention.
Figure 6:
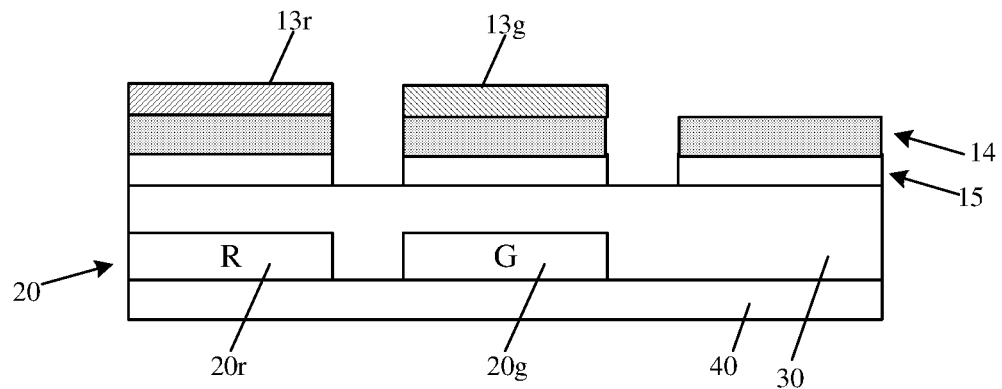
FIG. 6 is a structural diagram after formation of light emitting layers of a red organic light emitting diode and a green organic light emitting diode, during the manufacture process of the organic light emitting display panel according to the embodiment of the present invention.
Figure 7:
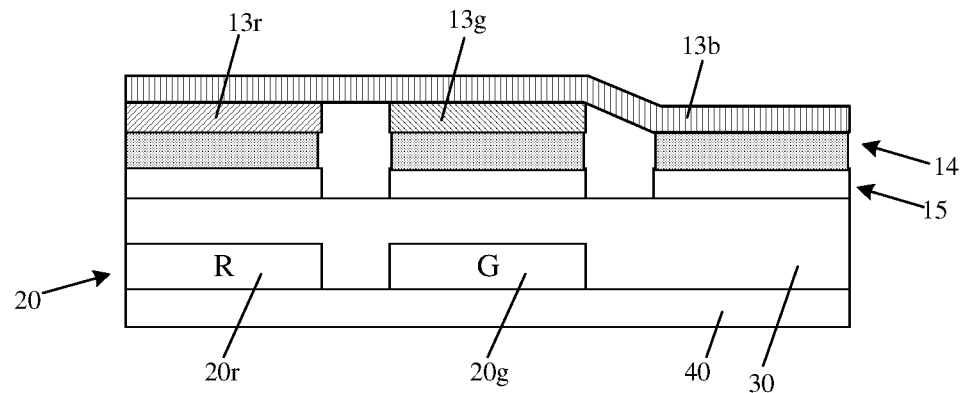
FIG. 7 is a structural diagram after formation of a light emitting layer of a blue organic light emitting diode during the manufacture process of the organic light emitting display panel according to the embodiment of the present invention.
Figure 8:
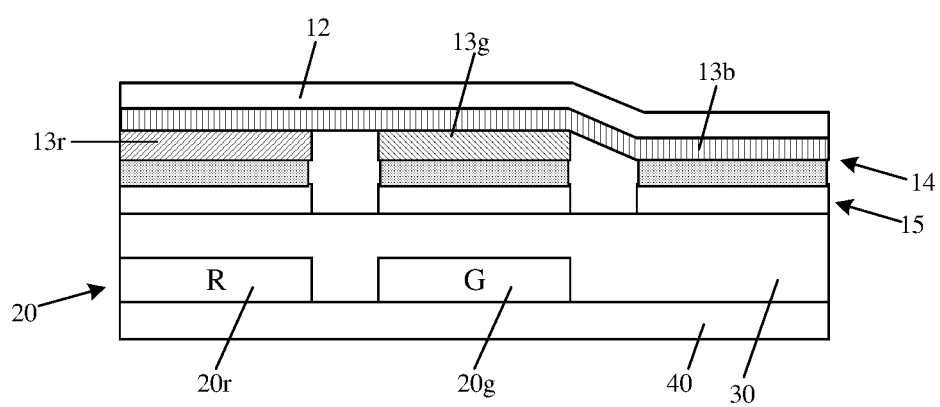
FIG. 8 is a structural diagram after formation of a first function layer during the manufacture process of the organic light emitting display panel according to the embodiment of the present invention.

Specifically, the step of forming the plurality of organic light emitting diodes in at least one of the pixel regions includes:

forming, in at least one of the pixel regions, a plurality of second electrodes 15 (as shown in FIG. 4) corresponding to the plurality of the organic light emitting diodes, respectively, wherein the second electrodes 15 may include transparent conductive material such as indium tin oxide, indium zinc oxide or the like, and may fabricated by photolithography patterning process;

forming, on the plurality of the second electrodes 15, a plurality of second function layers 14 (as shown in FIG. 5) corresponding to the plurality of the second electrodes 15, respectively, by means of a solution method, in which the hole injection layer and the hole transport layer as described above may be formed sequentially by means of the solution method, wherein the solution method may include any one of spin coating, blade coating, electrical spray coating, relief printing, gravure printing, silk-screen printing and the like;

forming a light emitting layer 13r of the red organic light emitting diode 10r, a light emitting layer 13g of the green organic light emitting diode 10g and a light emitting layer 13b of the blue organic light emitting diode 10b, respectively, on the second function layer 14 (as shown in FIGS. 6 and 7);

forming, on the light emitting layers, a first function layer 12 (as shown in FIG. 8) covering the entire pixel region by means of vapor deposition, in which the electron transport layer and the electron injection layer may be formed sequentially by means of vapor deposition; and forming, on the first function layer 12, a first electrode 11 covering the entire pixel region by means of vapor deposition, wherein FIG. 2 shows a structure after formation of the first electrode 11, and the first electrode 11 may include a metal material of lithium, sodium, potassium, calcium, barium, magnesium, silver, aluminum or the like.

It can be understood that in a case where a plurality of organic light emitting diodes are required to be formed in each of the plurality of pixel regions of the base substrate 40, the second electrodes 15 of the organic light emitting diodes in the plurality of pixel regions are formed simultaneously, the second function layers 14 of the organic light emitting diodes in the plurality of pixel regions are formed simultaneously, the first function layers 12 of the organic light emitting diodes in the plurality of pixel regions are formed simultaneously, and the light emitting layers of the organic light emitting diodes having a same color are formed simultaneously.

In view of process conditions of the solution method and stability of material of the light emitting layer 13b of the blue organic light emitting diode 10b, the light emitting layer 13b of the blue organic light emitting diode 10b may be formed by vapor deposition. Specifically, the step of forming a light emitting layer 13r of the red organic light emitting diode 10r, a light emitting layer 13g of the green organic light emitting diode 10g and a light emitting layer 13b of the blue organic light emitting diode 10b includes:

forming, by means of the solution method, the light emitting layer 13r of the red organic light emitting diode 10r on the second function layer 14 of the red organic light emitting diode 10r, and the light emitting layer 13g of the green organic light emitting diode 10g on the second function layer 14 of the green organic light emitting diode 10g, as shown in FIG. 6; and forming, by means of vapor deposition, the light emitting layer 13b of the blue organic light emitting diode 10b within the entire pixel region, such that the light emitting layer 13b of the blue organic light emitting diode 10b is above the light emitting layers 13r and 13g of the red organic light emitting diode 10r and the green organic light emitting diode 10g, as shown in FIG. 7. Material mixture between a layer and a previous layer can be prevented by forming the layer by means of vapor deposition.

Since the light emitting layer 13b of the blue organic light emitting diode 10b formed by vapor deposition covers the light emitting layer 13r of the red organic light emitting diode 10r and the light emitting layer 13g of the green organic light emitting diode 10g, respective light emitting layers should have such thicknesses that portions of the light emitting layer 13b corresponding to the red and green organic light emitting diodes 10r and 10g do not emit light when a voltage is applied to the second electrode 15 and the first electrode 11 of the red organic light emitting diode 10r or the green organic light emitting diode 10g. For example, the light emitting layer 13b of the blue organic light emitting diode 10b has a thickness ranging from about 20 nm to about 50 nm, the light emitting layers 13r and 13g of the red organic light emitting diode 10r and the green organic light emitting diode 10g have a thickness ranging from about 40 nm to about 80 nm.

As another aspect of the present invention, there is provided a display device including the above organic light emitting display panel.

In the above pixel structure, the luminous efficiency of the blue organic light emitting diode is significantly improved while the color purity is barely affected, so luminous efficiency is improved and power consumption is reduced without affecting color purity of the light emitted from the organic light emitting display panel, thereby reducing power consumption of the display device and extending its lifetime.

It can be understood that the foregoing embodiments are merely exemplary embodiments used for describing the principle of the present invention, but the present invention is not limited thereto. Those of ordinary skill in the art may make various modifications and improvements without departing from the spirit and essence of the present invention, and these modifications and improvements shall fall into the protection scope of the present invention.

What is claimed is:
1. A pixel structure, comprising:
a plurality of organic light emitting diodes capable of emitting light of multiple colors, the plurality of the organic light emitting diodes including a red organic light emitting diode, a green organic light emitting diode and a blue organic light emitting diode; and a plurality of light filtering portions provided at a light emitting side of the plurality of organic light emitting diodes, wherein each light filtering portion is provided in correspondence with each of a part of the organic light emitting diodes, such that light emitted from each of the part of the organic light emitting diodes passes through corresponding light filtering portion while light emitted from the remaining of the organic light emitting diodes does not pass through any light filtering portion, each of the light filtering portions processes light having a color corresponding to a color of light emitted by corresponding organic light emitting diode, each organic light emitting diode includes a first electrode, a first function layer, a light emitting layer, a second function layer and a second electrode arranged sequentially along a light-exiting direction, and the light emitting layer of the blue organic light emitting diode extends onto and covers the light emitting layer of the red organic light emitting diode and the light emitting layer of the green organic light emitting diode, which are separated from each other and have different materials.

2. The pixel structure according to claim 1, wherein the light filtering portion includes a color resistance block, which is capable of processing light having the same color as that of light emitted by the corresponding organic light emitting diode.

3. The pixel structure according to claim 2, wherein the light filtering portions include a red color resistance block arranged in correspondence with the red organic light emitting diode and a green color resistance block arranged in correspondence with the green organic light emitting diode.

4. The pixel structure according to claim 3, wherein the light emitting layer of the blue organic light emitting diodes covers an entire area of the pixel structure, and the light emitting layer of the red organic light emitting diode and the light emitting layer of the green organic light emitting diode are arranged at a same layer between the light emitting layer of the blue organic light emitting diode and the second electrode.

5. The pixel structure according to claim 3, wherein the first electrodes of the plurality of the organic light emitting diodes are formed as an integrated structure, and the first function layers of the plurality of the organic light emitting diodes are formed as an integrated structure.

6. The pixel structure according to claim 3, wherein the first function layer includes an electron transport layer and an electron injection layer disposed between the electron transport layer and the first electrode, and the second function layer includes a hole transport layer and a hole injection layer disposed between the hole transport layer and the second electrode.

7. The pixel structure according to claim 1, wherein the plurality of light filtering portions are disposed between the organic light emitting diodes and a base substrate, and the pixel structure further includes a transparent planarization layer provided between the plurality of light filtering portions, the base substrate and the organic light emitting diodes.

8. The pixel structure according to claim 7, further comprising a plurality of thin film transistors provided in correspondence with each of the plurality of the organic light emitting diodes, respectively, the plurality of thin film transistors being disposed between the base substrate and the plurality of light filtering portions, a drain electrode of each of the thin film transistors being connected to the second electrode of the corresponding organic light emitting diode through a via in the planarization layer, a source electrode of each of the thin film transistors being connected to a data line, and a gate electrode of each of the thin film transistors being connected to a gate line.

9. The pixel structure according to claim 4, wherein the light emitting layer of the blue organic light emitting diode has a thickness ranging from 20 nm to 50 nm, and each of the light emitting layers of the red organic light emitting diode and the green organic light emitting diode has a thickness ranging from 40 nm to 80 nm.

10. An organic light emitting display panel, including a base substrate divided into a plurality of pixel regions, wherein the pixel structure according to claim 1 is provided in at least one of the pixel regions.

11. A method for fabricating an organic light emitting display panel, comprising steps of:

providing a base substrate which is divided into a plurality of pixel regions;

forming, in at least one of the pixel regions, a plurality of organic light emitting diodes which are capable of emitting light of multiple colors, the plurality of the organic light emitting diodes including a red organic light emitting diode, a green organic light emitting diode and a blue organic light emitting diode, the light filtering portions include color resistance blocks; and forming a plurality of light filtering portions at a light emitting side of the plurality of organic light emitting diodes, each light filtering portion being provided in correspondence with each of a part of the organic light emitting diodes, such that light emitted from each of the part of the organic light emitting diodes passes through corresponding light filtering portion while light emitted from the remaining of the organic light emitting diodes does not pass through any light filtering portion, and the light filtering portions each process light having a color corresponding to the color of light emitted by corresponding organic light emitting diode, wherein the step of forming the plurality of organic light emitting diodes in at least one of the pixel regions includes:

forming, in at least one of the pixel regions, a plurality of second electrodes corresponding to the plurality of the organic light emitting diodes, respectively;

forming, on the plurality of the second electrodes, a plurality of second function layers corresponding to the plurality of the second electrodes, respectively, by means of a solution method;

forming a light emitting layer of the red organic light emitting diode, a light emitting layer of the green organic light emitting diode and a light emitting layer of the blue organic light emitting diode, respectively, on the second function layer, the light emitting layer of the red organic light emitting diode and the light emitting layer of the green organic light emitting diode being separated from each other and having different materials;

forming, on the light emitting layers, a first function layer covering the entire pixel region by means of vapor deposition; and forming, on the first function layer, a first electrode covering the entire pixel region by means of vapor deposition.

12. The method according to claim 11, wherein the step of forming the plurality of light filtering portions at the light emitting side of the plurality of organic light emitting diodes includes:

forming a red color resistance block and a green color resistance block at light emitting sides of the red organic light emitting diode and the green organic light emitting diode, respectively.

13. The method according to claim 12, wherein the step of forming the light emitting layer of the red organic light emitting diode, the light emitting layer of the green organic light emitting diode and the light emitting layer of the blue organic light emitting diode includes:

forming, by means of the solution method, the light emitting layer of the red organic light emitting diode on the second function layer of the red organic light emitting diode, and the light emitting layer of the green organic light emitting diode on the second function layer of the green organic light emitting diode; and forming, by means of vapor deposition, the light emitting layer of the blue organic light emitting diode within the entire pixel region, such that the light emitting layer of the blue organic light emitting diode is above the light emitting layers of the red organic light emitting diode and the green organic light emitting diode, and covers the light emitting layers of the red organic light emitting diode and the green organic light emitting diode.

14. The method according to claim 13, further comprising a step of:

forming a transparent planarization layer, before the step of forming the plurality of organic light emitting diodes in at least one of the pixel regions and after the step of forming the plurality of light filtering portions at the light emitting side of the plurality of organic light emitting diodes.

15. A display device, comprising the organic light emitting display panel according to claim 10.

* * * * *